(12) United States Patent
Nakabayashi et al.

(10) Patent No.: US 9,368,704 B2
(45) Date of Patent: Jun. 14, 2016

(54) LEAD FRAME AND LIGHT EMITTING DEVICE

(71) Applicant: NICHIA CORPORATION, Anan-shi, Tokushima (JP)

(72) Inventors: Takuya Nakabayashi, Tokushima (JP); Yoshitaka Bando, Anan (JP); Hiroto Tamaki, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/196,754

(22) Filed: Mar. 4, 2014

(65) Prior Publication Data

US 2014/0252401 A1 Sep. 11, 2014

(30) Foreign Application Priority Data

Mar. 5, 2013 (JP) .................. 2013-043544

(51) Int. Cl.
*H01L 33/00* (2010.01)
*H01L 33/62* (2010.01)
*H01L 23/495* (2006.01)

(52) U.S. Cl.
CPC .............. *H01L 33/62* (2013.01); *H01L 23/495* (2013.01); *H01L 2924/0002* (2013.01)

(58) Field of Classification Search
CPC ............ H01L 23/495; H01L 23/49537; H01L 23/49575; H01L 23/49582; H01L 23/498; H01L 31/162

USPC ........................................... 257/70–103, 666
See application file for complete search history.

(56) References Cited

U.S. PATENT DOCUMENTS

| 5,884,305 A * | 3/1999 | Kleinberg et al. |
| 2010/0314654 A1* | 12/2010 | Hayashi ......................... 257/99 |
| 2013/0062649 A1* | 3/2013 | Hata ..................... H01L 33/501 257/98 |

FOREIGN PATENT DOCUMENTS

| JP | 03188658 A | * | 8/1991 |
| JP | 05-102386 A | | 4/1993 |
| JP | 2011-151069 A | | 8/2011 |

\* cited by examiner

*Primary Examiner* — Brook Kebede
(74) *Attorney, Agent, or Firm* — Global IP Counselors, LLP

(57) ABSTRACT

A lead frame of high quality which can endure direct bonding to a light emitting element, and a light emitting device of high reliability which utilizing the lead frame. A lead frame includes a clad material which is a stacked layer of at least a first metal layer and a second metal layer, the second metal layer made of a metal which is different from the metal of the first metal layer, and a through portion. In the through-portion, an end surface of the first metal layer and an end surface of the second metal layer are covered with a plated layer. The end surface of either the first metal layer or the second metal layer protrudes farther into the through-portion than the end surface of the other metal layer.

12 Claims, 7 Drawing Sheets

LEAD FRAME AND LIGHT EMITTING DEVICE

CROSS-REFERENCE TO RELATED APPLICATION

This application claims priority to Japanese Patent Application No. 2013-043544, filed on Mar. 5, 2013. The entire disclosure of Japanese Patent Application No. 2013-043544 is hereby incorporated herein by reference.

BACKGROUND

1. Technical Field

The present invention relates to a lead frame and a light emitting device applicable to purposes such as an indicator, a lighting apparatus, a display, a backlight light source for liquid crystal display.

2. Background Art

In recent years, various electronic components have been proposed and are put in practical use, and increasingly high performance has been required on such components. In particular, electric components are required for maintaining performance for a long period of time even under severe environment. The same applies for semiconductor devices such as light emitting diodes (LEDs). Requirements for higher performance in the area of general lighting, in-vehicle lighting, and the like, further higher output (higher luminance) and higher reliability are demanded. Accordingly, for example, JP H05-102386A proposes a clad material having a stacked-layer structure obtained by way of roll welding for a lead frame material that has a high degree of hardness and a high electrical conductivity.

Also, depending on the usage of the light emitting device, further reduction in size of the electric components while retaining the high performance has been demanded. Accordingly, various adjustments have been made in the structure of the package as well as in the structure of the light emitting element. For example, in a light emitting device capable of further reducing the thickness, a provision of irregular shape on the opposing end surfaces of the die pads and the lead portions is proposed to obtain adhesion of the light emitting element with the sealing resin and the leads (for example, JP2011-151069A etc.).

SUMMARY

The present invention is devised to solve the problems as described above, and an object of the present invention is to provide a lead frame of high quality which can endure direct bonding to a light emitting element, and to provide a light emitting device of high reliability which utilizing the lead frame.

The embodiments include the aspects described below.

(1) A lead frame includes a clad material which is a stacked layer of at least a first metal layer and a second metal layer, the second metal layer made of a metal which is different from the metal of the first metal layer, and a through portion. In the through-portion, an end surface of the first metal layer and an end surface of the second metal layer are covered with a plated layer. The end surface of the first metal layer or the end surface of the second metal layer protrudes farther into the through-portion than the end surface of the other metal layer.

(2) A light emitting device includes a light emitting element having a pair of electrodes on the same surface side, a lead frame which includes lead portions which are arranged spaced apart from and opposite to each other and electrically connected to the pair of electrodes respectively via a bonding member, and a resin member fixing the lead frame and, between the lead portions which are arranged spaced apart from and opposite to each other, covering all the end surfaces of the lead frame in the thickness direction.

According to the disclosure, a lead frame of high quality which can endure direct bonding to a light emitting element can be provided. Also, with the use of the lead frame, a light emitting device which enables further reduction in size and in thickness can be provided.

DETAILED DESCRIPTION

Figure 1A:
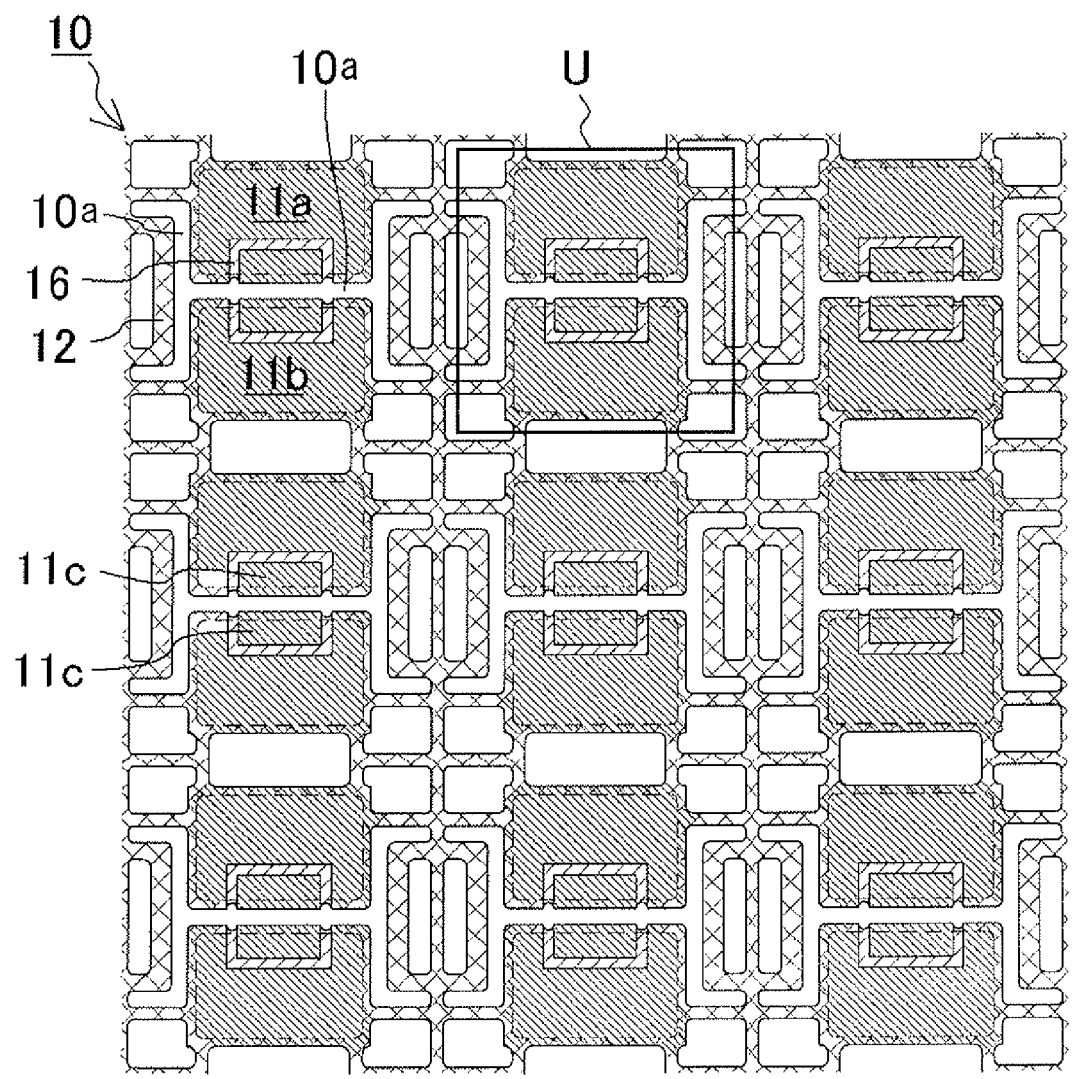
FIG. 1A is a plan view showing a lead frame assembly in which a plurality of lead frame units according to Embodiment 1 is connected.

Preferred embodiments of the light emitting device according to the present invention will be described below with reference to the drawings. The sizes and the positional relationships of the members in each of drawings are occasionally shown exaggerated for ease of explanation. Further, in the description below, the same designations or the same reference numerals may, in principle, denote the same or like members and duplicative descriptions will be appropriately omitted.

Lead Frame

The lead frame according to the embodiments is made of a metal plate employing a clad material as a base material and defines a through portion (through-hole, see 10a, FIG. 1A) penetrating from the surface to the back-surface. In the through portion, the end surface of the first metal later (inner wall defining the through-hole) and the end surface of the second metal (inner wall defining the through hole) are covered with a plated layer, and the end surface of either the first metal layer or the second metal layer is more protruded than the end surface of the other metal layer.

Clad Material

The clad material may include a stacked-layer structure of at least a first metal layer and a second metal layer which is different from the first metal layer. Further, a through-portion 10a, penetrating through the first metal layer and the second metal layer, that is penetrating through the clad material is defined. In the through portion of the clad material, the end surface (inner wall surface defining the through-hole) of either the first metal layer or the second metal layer is more protruded than the end surface of the other metal layer. The first metal layer and the second metal layer are needed to have different compositions, and materials which contain the same metal element can also be employed. Examples of different metals include metal materials whose linear expansion coefficient and/or thermal expansion coefficient, solubility to a specific etching solution, electrical conductivity, thermal conductivity, reflectance and/or hardness, is different with each other. Among those, metals having different linear expansion coefficient and solubility to a specific etching solution to each other are preferably employed.

Examples of the material for the first metal layer and the second metal layer include metals such as Fe, Ni, Cu, Co, Ti, Sc, Nb, Zn, Zr, W, Mo, Ta, Al, Au, Pt, Ag, Rh, Ru, Pd, Os, Ir, Hf, V, Mn, Cr, La, Y, Sn, and alloys of those. Fe, Ni, and/or Cu is preferably used as its major component. Also, an inclusion of a minute amount of non-metallic elements such as Si, P may be allowed. More specifically, in the case where the first metal layer has a linear expansion coefficient or solubility to a specific etching solution greater than that of the second metal layer, copper or copper alloy is preferable and copper that has an excellent heat dissipating property is more preferable. Particularly, oxygen-free copper that has little impurity and a high thermal conductivity is further preferable. For example, the use of Cu for the portions which serve as the electrode terminals allows obtaining of a semiconductor which can facilitate soldering and has good heat dissipation. Also the use of a copper alloy such as a 194 alloy a EFTEC alloy, or a KFC alloy can facilitates the productivity of the clad material, and can reduce occurrence of warpage, deformation, or the like during processing. The second metal layer is preferably made of iron or an iron alloy, more preferably made of an Inver, a SPCC, a Kovar, or a SUS etc., and further preferably made of a Fe—Ni alloy which has good versatility and workability, or has a low linear expansion coefficient at room temperature.

As described above, adopting a clad material with a stacked-layer structure of the first metal layer and the second metal layer which are made of different metals, properties described above can be used in various appropriate combinations, so that while further securing the reliability of the lead frame and of the light emitting device which uses the lead frame, higher quality can also be achieved. Particularly, in the case where the first metal layer has a thermal expansion coefficient and/or linear expansion coefficient greater than that of the second metal layer, the difference in the linear expansion coefficients with respect to the light emitting element or the like can be reduced to minimum, or the linear expansion coefficient of the bonding member used for bonding the light emitting element can be approximated with that of the semiconductor element. As a result, destruction in the bonding between the light emitting element and the lead frame becomes possible to be efficiently prevented. This effect is remarkable in a face-down type light emitting device in which, the lead portions are electrically connected to a pair of electrodes of a slight emitting element via a bonding member. In the case where the first metal layer has a solubility to the etching solution greater than that of the second metal layer, a shape in which the end surface of one of the first metal layer and the second metal layer further protruding than the end surface of the other metal layer can be easily processed.

Typical examples of a specific etching solution include a solution of ferric chloride or copper chloride. The concentration of the solution is not specifically limited, and in consideration of the type of the first metal layer and the second metal layer, the thickness, the mask pattern used in the etching, etc., a concentration generally used in etching can be applied.

The lead frame of the embodiments is sufficient to contain a stacked-layer structure of a first metal and a second metal, and preferably has a so-called full surface overlay structure, but may have a structure which includes a part with an overlay structure, an inlay structure, or an edgeless structure. Also, a three layer structure, a four or more layer structure may be included. In this case, a plurality of one of or both the first metal layer and the second metal layer may be included. The third, the fourth, . . . the n-th metal layer etc., which are different from those metal layers may be further stacked between the first metal layer and the second metal layer, or stacked on one or both surfaces of the stacked layer of the first metal layer and the second metal layer. The third metal layer etc., of different layers in this case can be made of the materials selected from the materials exemplified for the first metal layer and the second metal layer.

Among those, the lead frame preferably made of a clad material which includes a two layer structure made of the first metal layer and the second metal layer, or which includes a three layer structure or a five layer structure which is made of the first metal layer and the second metal layer alternately bonded in this order. In the case where a clad material having a two layer structure is included, the first metal layer is preferably arranged at the light emitting element side. With this structure, an irregular or rough texture on the end surface can be easily adjusted. Also, appropriately selecting the materials of the first metal layer and the second metal layer allows adjusting of the linear expansion coefficient which allows reliable prevention of destruction in the bonding and reliable heat dissipation.

The thickness of the first metal layer and the second metal layer is not specifically limited and for example the first metal layer and the second metal layer can be formed with a thickness of about several tens of μm to about several hundreds of p.m. Particularly, in a two-layer structure made of the first metal layer and the second metal layer, the first metal layer of about 10 μm to about 300 μm and the second metal layer of about 10 μm to about 300 μm may be employed. In a three-layer structure made of the first metal layer, the second metal layer, and the first metal layer bonded in this order, the first metal layers may respectively have a thickness of about 50 μm to about 200 μm and the second metal layer may have a thickness of about 50 μm to about 200 μm. In this case, the first metal layers may have the same thickness or may have different thicknesses. The lead frame preferably has a total thickness of about 100 μm to 1000 μm.

In the case where a shape includes the end surface of either of the first metal layer or the second metal layer protruded more than the end surface of the other, a shape which can exert maximum anchor effect is preferably designed. For example, the end surface of the second metal layer is preferably protruded more than the end surface of the first metal layer. Also, all the end surface of either the first metal layer or the second metal layer are preferably more protruding than the end surface of the other metal layer. Further, in a clad material having a three-layer structure made of a first metal layer, a second layer, and a first metal layer stacked in this order, the end surface of the second metal layer is preferably more protruded than the end surface of the first metal layer. Accordingly, the anchor effect can be efficiently obtained. Further, the end surface of the second metal layer is slanted so that one end of the end surface of the second metal layer meets the adjacent end of one of the first metal layer and the other end of the end surface of the second metal layer meets the adjacent end of the other first metal layer.

Further, the end surface of the first metal layer is preferably arranged at inner side than all the end surface of the second metal layer.

Further, the end of the first metal layer adjacent to the second metal layer is located at outer side than the end of the first metal layer which is located opposite side from the second metal layer.

(Plated Layer)

In addition to the first metal layer and the second metal layer or the third metal layer, the lead frame may have a plated layer covering the end surface (end surface of each metal layer). of the clad material. Further, the plated layer is preferably disposed to cover the surface or the back-surface of the clad material, or to cover both the surface and the back-surface of the clad material. Examples of the material of the plated layer include Ag, Al, Au or an alloy of those. Among those, a plated layer of Ag is preferable. Accordingly, light from the light emitting element becomes possible to be extracted efficiently. In the case where the first metal layer and/or the second metal layer is not present at the outermost surface of the clad material, the plated layer is not applied in contact with the first metal layer and/or the second metal layer, but is applied in contact with the layer which presents at the outermost surface of the clad material. Also, on the surfaces of the clad material (end surface, upper surface, lower surface), a plated under layer is preferably formed. For example, in the case where the outermost surface to be a Ag plated layer, a plated layer of Cu, Ni, or the like is preferably formed as the plated. The plated layer may be formed before processing the lead frame, but in the case where the end surface of the through-portion (inner wall defining the through-hole) to be processed, the plated layer may be formed after processing (patterning) the lead frame, to be described below. The thickness of the plated layer is not specifically limited, and for example, about 1 µm to about 10 µm may be employed.

The lead frame having a stacked layer structure can be produced by using a known method or according to a known method. Examples of such methods include, a hot-rolling method in which a core material and a surface material in solid state are welded under high temperature and pressure in pressure welding, a fusion welding method such as overlay welding, casting, or tinkering, a non-fusion welding method such as rolling welding, explosive welding, or diffusion welding, or a semi-fusion welding method such as sintering or thermal spraying. More specific examples include a method described in JP H05-102386A. Particularly, a material in which copper or a copper alloy is joined on a core material made of an iron-based alloy such as a ferric stainless steel which is a ferromagnetic substance is preferable.

The processing technique for projecting the end surface of either the first metal layer or the second metal layer more than the end surface of the other metal layer is not specifically limited, and for example, a wet etching technique using an etching solution which has different etching rates for the first metal layer and the second metal layer can be employed. In this case, etching is suitably performed on one surface of the lead frame with the use of a mask-pattern which provides masking or opening of a desired shape. The etching is preferably performed on both surfaces of the lead frame with the use of a mask-pattern which provides masking or opening of a desired shape. With this, the processing time and the processing cost can be reduced. The mask patterns formed on the both surfaces may have the same shape or different shapes. But in the use of the mask patterns formed on the both surfaces, in a plan view, it is preferable that the etching regions on the both surfaces coincide with each other, and more preferably, the central line of the mask patterns match with each other.

Also, it may be such that with the use of a technique such as pressing, punching, blasting, or the like, which is generally used in processing a lead frame, a desired pattern is formed in the lead frame. Then, a mask pattern which has an opening which is only for the outermost metal layers of the first metal layer and the second metal layer is formed, and performing blasting, etching, etc., a shape in which the end surface of the first metal layer or the second metal layer is protruded more than the end surface of the other end surface.

In the use of those processing technique, a clad material having a stacked layer structure of two or more metal materials may be processed to obtain a shape corresponding to a pair of lead frames (single unit) to be described below, but generally preferably a plurality of such a single unit connected in a longitudinal directions and/or a direction perpendicular to the longitudinal direction is processed together. Thus, the lead frames of the embodiments include an assembly of plurality of units in which the plurality of unit is connected in a longitudinal directions and/or a direction perpendicular to the longitudinal direction. The use of such a processing technique can facilitate processing of the units for a plurality of light emitting device, and the end surface of either the first metal layer or the second metal layer can be formed more protruded than the end surface of the other metal layer and the degree of protrusion can be easily adjusted. With this arrangement, in the case used in a light emitting device, anchor effect to the resin member which will be described below, can be more efficiently exerted. Particularly effective in the application to the light emitting element (chip size) of extremely small size and the light emitting device of extremely low height.

As described above, in the case where the lead frame to have a plated layer disposed on the surface and/or the back surface and/or the end surface of the lead frame, the plating is preferably disposed after processing the clad layer. The lead frame is molded with a resin member, then, singulated (cut) into individual light emitting devices. Accordingly, the end surfaces of the cut portion of the lead frame may expose the first metal layer and the second metal layer, also, the end surfaces may not include a protruded portion and align in a same plane or in an approximately in a same plane. In some cases, a plated layer may not be provided on such end surfaces.

Light Emitting Device

The light emitting device according to the embodiment of the present invention includes, the lead frame describe above, a light emitting element, i.e., a light emitting element, mounted on the lead frame, and a resin member fixing the lead frame.

Light Emitting Element

The light emitting element is generally constituted with a semiconductor layer which may include a light emitting layer and which is stacked on a substrate. The light emitting element may also be constituted with a semiconductor layer obtained by, on a substrate, stacking a semiconductor layer which includes a light emitting layer and then, removing the substrate.

(Substrate)

The substrate is not specifically limited and for example, a substrate generally used for growing a nitride semiconductor layer can be employed. Among those, a light transmissive substrate is preferable. In the specification, the term "light transmissive" means properties of transmitting about 60% or greater, 65% or greater, 70% or greater or 80% or greater emission of the light emitted from the light emitting element. Examples of the substrate include sapphire, spinel, NGO, $LiAlO_2$, $LiGaO_3$, GaN, etc. Among those, a substrate made of an oxide is preferable, a substrate made of a wurtzite-type crystal is more preferable, and a sapphire substrate is further preferable.

(Semiconductor Layer)

The semiconductor layer stacked on the substrate (for example, on the first main surface) preferably includes at least a light emitting structure. More specifically, the semiconductor layer may include, for example, on the substrate, a first semiconductor layer (n-type semiconductor layer), a light emitting layer, and a second semiconductor layer (p-type semiconductor layer) which are stacked in this order.

The semiconductor layer includes a structure in which a part of the second semiconductor layer is removed in the thickness direction, in other words, partially removed, and on which the first semiconductor layer is exposed, and on the region of the first semiconductor layer other than the exposed region, the light emitting layer and the second semiconductor layer are stacked. The first semiconductor layer, the light emitting layer, and the second semiconductor layer which are among the components of the semiconductor layer are not specifically limited, and for example, nitride-based compound semiconductors such as $In_XAl_YGa_{1-X-Y}N$ ($0 \leq X$, $0 \leq Y$, $X+Y \leq 1$) can be preferably used. Those nitride semiconductor layers may respectively have a single layer structure, a stacked layer structure made of layers having different compositions and/or thicknesses, or a superlattice structure etc. Particularly, the light emitting layer preferably has a single quantum well structure or a multi-quantum well structure in which thin layers are stacked to produce quantum effect.

(Electrode)

A pair of electrodes of a light emitting element is arranged on a same surface side of the semiconductor layer. The pair of the electrodes may have either a single layer structure or a stacked layer structure which can be ohmically connected to the first semiconductor layer and the second semiconductor layer described above respectively, which provides a linear or semi-linear current-voltage characteristics. Such electrodes can be formed using any suitable material and structure known in the art, with an appropriate thickness respectively.

Particularly, as described below, in the case where the pair of electrodes of the light emitting element is electrically connected to the lead portions via a bonding member respectively, a reflective layer is preferably disposed as the layer closest to the semiconductor layer on each of the pair of the electrode.

The reflective layer is preferably made of a material which has relatively large wavelength dependency in visible light range, and particularly, made of a material whose reflectivity abruptly increases in near violet range to a long wave range. More specifically, the reflective layer is preferably made of a material which can efficiently reflect light of wavelength region (to red region) 350 nm or greater, more preferably 380 nm or greater, further preferably 400 nm or greater. More specifically, Ag or an alloy of Ag may be employed. Examples of Ag alloys include an alloy of Ag with one or at least two metal elements selected from the group consisting of Pt, Co, Au, Pd, Ti, Mn, V, Cr, Zr, Rh, Cu, Al, Mg, Bi, Sn, Ir, Ga, Nd, and Re. The thickness of the reflective layer may be suitably, in view of efficiently reflecting the incident light, about several tens of nm to about several tens of nm to about several μm. With the use of the materials described above, light emitted from the semiconductor layer is reflected and is efficiently extracted. In addition, a light emitting device having good heat dissipation properties can be obtained. As a result, generation of heat at the time of applying a large current can be reduced and thus the light emitting element of higher output can be realized.

The pair of electrodes of the light emitting element is generally electrically connected respectively to the lead portions of the lead frame to be described below, through a bonding member. That is, connected in a face-down manner.

(Bonding Member)

The bonding member can be formed using a material which is generally used at the time of bonding a light emitting element, and for example, a eutectic alloy may be used. Examples of preferable eutectic alloy include a eutectic alloy film such as an alloy whose main components are Au and Sn, an alloy whose main components are Au and Si, and an alloy whose main components are Au and Ge. Among those, an AuSn eutectic alloy is preferable. The use of an Au—Sn eutectic alloy can reduce the degradation of the electrodes of the light emitting element caused by the thermocompression bonding, and also allows for firm bonding to the lead frame.

(Lead Frame)

In a single light emitting device, the lead frame includes lead portions where at least a pair of positive and negative electrode terminals are arranged spaced apart from and opposite to each other, and electrically connected to the pair of electrodes of a light emitting element via a bonding member. In the specification, the term "lead portions" refers to the portions which are exposed from the resin member to be described below, and are electrically connected to the electrodes of a light emitting element respectively. Therefore, a pair of lead portions are also arranged spaced apart from and opposite to each other. The lead frame may also include portions which are extensions of the lead portions such as a portion embedded in a resin member or a portion reinforcing the lead frame, a portion extended to outside of the resin member or to an end surface (exposed) to serve as an external terminal.

The planar shape of the lead frame is not specifically limited as long as arranged spaced apart from and opposite to each other. For example, the lead frame may be formed in a tabular shape or a corrugated shape, or partially thick or thin, or a bending tabular or corrugated shape.

Also, the shapes of the lead portions in the lead frame are not specifically limited, and in a plan view, a polygonal shape such as a quadrangular shape, a circular shape, an elliptical shape, a shapes similar to those, an irregular shape such as a comb-like shape or a saw blade-like shape, or further, a shape which is a combination of those may be employed.

In a single light emitting device, at least one pair the lead frames is provided, and further, one or more lead frame may also be provided to provide additional functions such as heat dissipation and reinforcement. In this case, those portions may be electrically separated from a pair of lead frames, or may be partially connected to the pair of lead frames. All the surfaces of the lead portions may be exposed from the resin member to be described below, or a part or the all portions thereof may be embedded in the resin member.

To the pair of lead frames (that is, the lead portions), a light emitting element is mounted in a bridged manner. In this case, the pair of electrodes of the light emitting element is opposite to the lead portion of one of the lead frame and the lead portion of the other lead frame and is electrically connected respectively.

(Resin Member)

The resin member serves to fix the lead frames. The resin member preferably has a reflective surface which can reflect light from the light emitting element. A resin such as a thermosetting resin or a thermoplastic resin can be employed as the resin member. Specific examples of such a resin include an epoxy resin composition; a silicone resin composition; a modified epoxy resin composition such as a silicone modified epoxy resin; a modified silicone resin composition such as an epoxy modified silicone resin; a polyimide resin composition, a modified polyimide resin composition, polyphthalamide (PPA), a polycarbonate resin; a polyphenylene sulfide (PPS); a liquid crystal polymer (LCP); an ABS resin (acrylonitrile-butadiene-styrene resin); a phenolic resin; an acrylic resin; and a PBT resin (polybutylene terephthalate resin). Particularly, a thermosetting resin is preferable. Among those, a resin preferably has the reflectivity with respect to the light from the light emitting element 60% or more, more preferably 70% or more, 80% or more or 90% or more.

For example, a light reflective material such as titanium oxide, silicon dioxide, zirconium dioxide, potassium titanate, alumina, aluminum nitride, boron nitride, and/or mullite. With this arrangement, light can be reflected efficiently. The light reflective material can be adjusted appropriately according to the conditions of molding such as a method of resin molding or the resin fluidity, or to the properties such as a reflectance and/or mechanical strength. For example, in the case where titanium oxide is employed, an amount of 20 to 40 weight %, further 25 to 35 weight % of titanium oxide is preferably contained with respect to the total weight of the resin material.

The resin member is arranged between the pair of lead frames (that is, lead portions) described above to insulatingly separate the pair of lead frames. The resin member arranged between the lead portions which are spaced apart from and opposite to each other preferably cover all the end surfaces in the thickness direction of the lead frames. As described above, the lead frame have a shape in which the end surface of the first metal layer or the second metal layer is protruded more than the end surface of the other metal layer, so that all the end surfaces in the thickness direction are covered and embedded in the resin member. Thus, the contact area between the lead frames and the resin member is increased and which improves the adhesion between the lead frames and the resin member. Also, with such a partial protrusion of the end surface of the lead frame, an anchor effect can be efficiently obtained. Particularly, as described above, in the case where the first metal layer, a second metal layer, and the third metal layer are bonded in this order to form a three layer structure, and in which all the end surfaces of the first metal layer or the second metal layer in the thickness direction protrude more than the end surfaces of the other metal layer, reliable anchor effect in both an upward direction and downward direction can be obtained. In the case where all the end surfaces in the thickness direction of the second metal layer are protruded more than all the end surfaces of the first metal layer or than the most-protruding end surface of the first metal layer, an anchor effect can also be exerted more efficiently to the resin portion, due to a difference in the linear expansion coefficient of the first metal layer and the second metal layer.

In the light emitting device according to the embodiments, a light transmissive member covering the light emitting element and a part of the lead frame is generally arranged independently from the resin member described above. The light transmissive member is, in view of light luminous intensity distribution and directivity of the light emitted from the light emitting element, a concave lens shape or a convex lens shape may be employed. Such a light transmissive member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins.

The light transmissive member may contain a wavelength converting member such as a fluorescent material capable of absorbing light from the light emitting element and emitting light of different wavelength. For example, an oxide-based fluorescent material, a sulfide-based fluorescent material, and/or a nitride-based fluorescent material etc., can be employed. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material to emit red light, can be used singly or in combination. The light transmissive member may contain a light diffusing agent (barium sulfate, titanium oxide, aluminum oxide, silicon oxide, etc.).

In the light emitting device, a protective element such as a Zener Diode, a Bridge Diode etc., may be arranged on the lead frame.

Embodiment 1

Figure 1B:
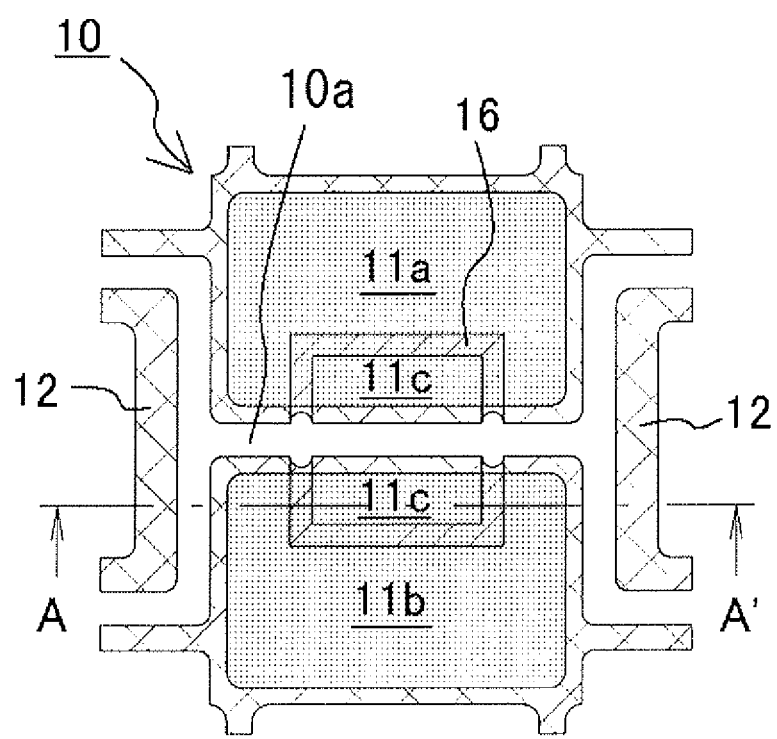
FIG. 1B is a plan view showing a lead frame unit shown in FIG. 1A.
Figure 1C:
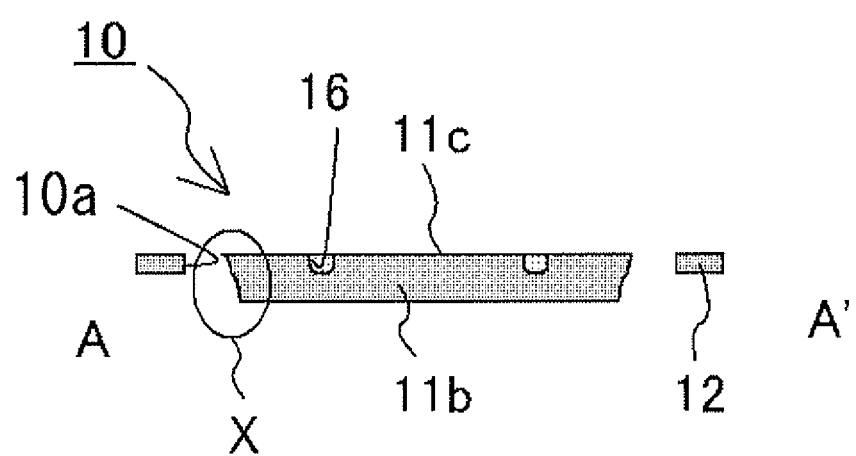
FIG. 1C is a cross sectional view taken along line A-A' of FIG. 1B.

On the lead frame 10 in Embodiment 1 includes, particularly, as shown in FIG. 1A, a single unit U which constitutes one light emitting device are arranged in plural in the longitudinal direction and the direction perpendicular to the longitudinal direction. Such a single unit U of the lead frame 10, as shown in FIG. 1B and FIG. 1C, is divided in two portions in a plan view via through-portion 10a, and a pair of positive and negative lead portions 11a, 11b are respectively arranged, also, support bars 12 are arranged at the both sides of the two lead portions 11a, 11b, so as to bridge from the lead portion 11a to the lead portion 11b. In other words, the support bars 12 are provided so that the side surface of the respective support bars 12 are arranged facing the sides of the lead portion 11a and the sides of the lead portions 11b with the length corresponding to each other. The lead portions 11a, 11b which are the portions divided in two, respectively include a light emitting element mounting region 11c demarcated by the groove 16 formed in the surface of the lead frame 10. With such an arrangement of the groove 16, excessive flow of the bonding member can be prevented at the time of bonding a light emitting element by using a bonding member such as a solder, which allows bonding of the light emitting element at an appropriate locations by using self alignment effect.

Figure 1D:
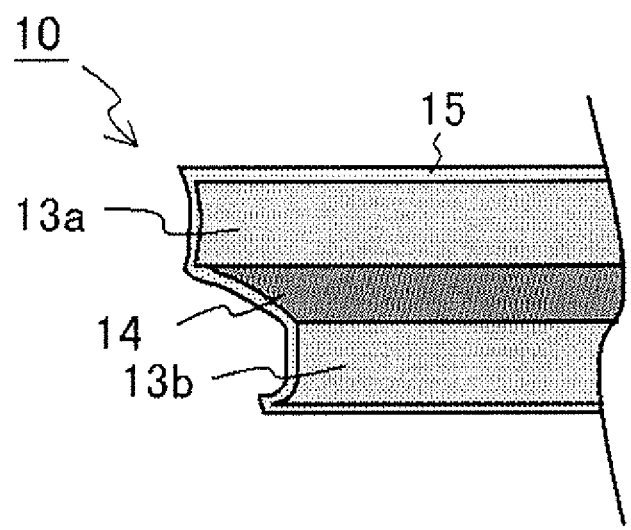
FIG. 1D is an enlarged view of a major portion X shown in FIG. 1C.

The lead frame 10 is made of a clad material, which is, particularly, as shown in FIG. 1D, from the top (from the side where a light emitting element to be disposed), a first metal layer (about 100 μm in thickness) made of a copper alloy (194), a second metal layer 14 (about 100 μm in thickness) made of an iron alloy (an Fe—Ni alloy, Ni content (36%) about 50 in thickness) are stacked to form a stack layer structure of a first metal layer 13/a second metal layer 14/a first metal layer 13b. The upper and lower surfaces of the clad material, that is, the outer surfaces of the first metal layer 13a, 13b and the end surface of the clad material are covered with a plated layer 15 made of Ag (about 2 to 3 μm in thickness).

In the lead frame 10, the end surface of the first metal layer 13a is more protruded than the end surface of the second metal layer 14. Accordingly, the anchor effect can be efficiently obtained. The end surface of the second metal layer 14 is slanted from the end of the second metal layer 14 side of the first metal layer 13a to meet the end of the second metal layer 14 side of the first metal layer 13b. Further, the end surface of the first metal layer 13b is located at inner side than any portions of the end surface of the first metal layer 13a. Further, the end of the first metal layer 13b adjacent to the second metal layer 14 is located at outer side than the end of the first metal layer 13b which is located opposite side from the second metal layer 14.

Such a lead frame can be manufactured according to the method below. First, a clad material having a stacked-layer structure of a first metal layer 13a/a second metal layer 14/a first metal layer 13b is prepared. In the clad material, the joining interface between the first metal layer and the second metal layer is diffusion-joined so as not to allow detachment between the metal layers. On the surface of the clad material, for example, a resist is disposed on the entire surface, and conducting a photolithography process, in detail, through carrying out exposure with the use of an exposure mask having a desired pattern, and then developing, a resist mask having a desired shape is disposed. The mask is used as the etching mask for the lead frame. The pattern shape in this case corresponds to the shapes shown in FIG. 1A and FIG. 1D. In a similar manner, a pattern of predetermined shape is formed on the back-surface of the clad material to form a resist mask. In this case, the pattern shape may be the same shape as that formed on the surface. Also, according to the pattern, a mask having different shape than that formed on the surface can be applied. For example, an opening with slightly greater width than the width of the opening of the mask formed on the surface may be employed. It is preferable that the center lines of the openings of the masks of the surface and the back-surface are arranged to overlap in projection view. After forming a mask made of a resist on the surface and the back-surface of the clad member, for example, at 45° C., a ferric chloride solution (hydrochloric acid concentration: 3.2 mol/L) is sprayed for about 6 minutes to etch the clad material from the surface side and the back-surface side to form the pattern.

Also, in the lead frame shown in FIG. 1A and FIG. 4, in the case where a groove 16 to be formed in the surface (upper surface) of the lead frame, as described above, the groove can be formed simultaneously in the etching to form the opening of the lead frame, or may be formed in a separate manufacturing step. For example, a mask having openings corresponding to the grooves 16 is formed on the surface (upper surface), and a mask which covers the entire back-surface is formed, then, for example, at 45° C., a ferric chloride solution (hydrochloric acid concentration: 3.2 mol/L) is sprayed for about 3 minutes to etch the clad material. Alternately, a mask having openings corresponding to the grooves 16 is formed on the upper surface, and on the back-surface, instead of forming the full-surface mask, a mask having openings corresponding to the outer periphery of the lead portions 11a, 11b including the element mounting portion 11c and the groove portion 16, a portion connected to the outer periphery, and when needed, openings corresponding to the support bar 12 is formed, to etch the clad material.

With this, the grooves 16 are etched from the surface side partially into the thickness direction for example, the first metal layer 1a in a part or all of its thickness direction). Further, the outer periphery of the lead portions 11a, 11b including the element mounting region 11c and the groove 16, the portions connected to the outer periphery, when needed the support bar 12 (portion shown by cross-hatching in FIG. 1A and FIG. 1B) are etched from the back-surface side partially into the thickness direction. Accordingly, in those portions, thicknesses can be reduced while retaining the planar shapes respectively. Accordingly, the problems as shown below can be solved. For example, as a method for partially changing the thickness of the lead frame in its thickness direction, press-working etc., has been used. However, when press working is applied, metals corresponding to the reduced thickness are pushed in the in-plane direction, resulting in a change of the planar shape. In recent years, corresponding to miniaturizing the light emitting devices, the distance between the electrodes and the terminals and their margins are also miniaturizing, and under such circumstances, a change in the planar shape may lead to short circuit between the electrodes and the terminals.

The lead frame may be cut by using press-working etc., to obtain a desired shape. At this time, arranging the cross-section to be a single material of the first metal member 26 or the second metal member 28 can eliminate a necessity of cutting a stack of different kinds of metal, which facilitates cutting of the lead frame in the press-working or etching, and thus preferable.

On the other hand, when such a change in the thickness as described above is applied in the lead frame of a light emitting device, a part of the lead (lead portions 11a, 11b, the element mounting portion 11c) can be exposed from both the upper surface and the lower surface of the resin member to utilize, and the heat dissipating properties of the light emitting element can be improved. On the surface side of the lead frame, a member having poor wettability to a metal bonding member (a solder etc.) can be filled in the groove 16. With this arrangement, the bonding member can be disposed on an appropriate location and easily demarcated in an appropriate size. Accordingly, self-alignment effect cab be appropriately produced at the time of bonding the light emitting element, facilitating arrangement of the light emitting element to its appropriate location. Further, the resin member can be applied on the outer peripheries of the lead portions 11a, 11b including the element mounting portion 11c and the groove 16, the portions connected to the outer periphery, and optionally the back-surface side of the support bar 12, so that short circuit of the lead frame can be prevented effectively.

Then, using a plating solution containing silver ions, a plated layer is formed on the surface of the lead frame. The conditions of plating can be appropriately adjusted according to the material etc. Before forming the plated layer, as a pretreatment, a degreasing treatment is preferably applied to remove organic substances from the surface of the lead frame. Next to degreasing treatment, surface activation of the lead frame with the use of oxidation or the like is preferably performed. Also, a layer which can improve the adhesion between the silver plated layer and the lead frame may be disposed. For example, a thin layer of about 0.2 μm thickness, such as a strike plated layer, may be disposed as an under layer. Further, a plated layer having a silver plated layer as its outermost surface can be made with various stacked-layer structures, for example, forming a stacked-layer of Ni/Pd/Au/Ag in this order from the lead frame side, a plated layer having high thermal resistance can be obtained. In the case where the lead frame contains iron, for example, a clad material such as Cu/Fe/Cu is employed, the end surface of Fe exposed by the working may be covered with a plated layer. Thus, the end surface of Fe can be prevented from corrosion. Accordingly, a lead frame having an end surface described above can be obtained.

Embodiment 2

Figure 2A:
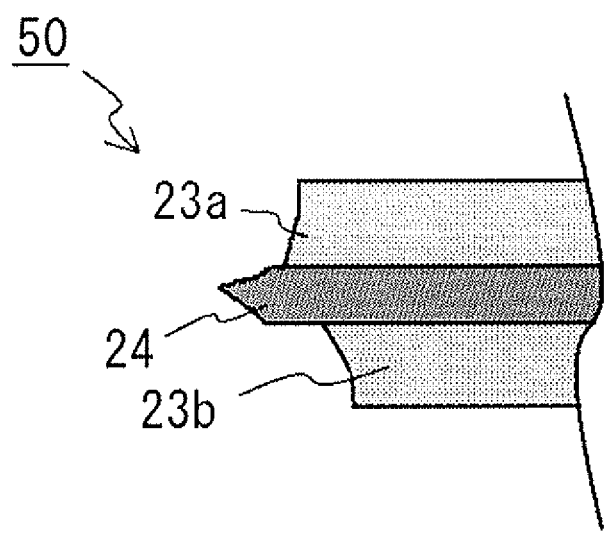
FIG. 2A is a cross-sectional view showing a major part of a lead frame according to Embodiment 2 of the present invention.

The lead frame 50 according to Embodiment 2 has a similar structure as the lead frame according to Embodiment 1, except that, particularly shown in FIG. 2A, the lead frame 50 is made of a clad material in which a first metal layer 23a of a layer (about 100 µm thickness) made of copper, and a second metal layer 24 of a layer (about 100 µm thickness) made of an iron alloy (Fe—Ni alloy, Ni: 36%) are stacked to form a stacked-layer structure of first metal layer 23a/second metal layer 24/first metal layer 23b, and in the shape of the end surfaces, the second metal layer 24 is protruded more than the first metal layers 23a, 23b.

Such a lead frame 50 can be manufactured according to the method below. The lead frame 50 can be manufactured in a similar manner as in Embodiment 1, except that, in Embodiment 2, for example, the etching solution of the lead frame used in Embodiment 1 is changed to a copper chloride solution, and the size of the opening of the mask made of a resist and etching conditions are adjusted. For example, after forming a resist mask on the upper surface and the lower surface of the lead frame (clad material), at 45° C., a copper chloride solution ($CuCl_3$ concentration: 2.2 mol/L, chloride concentration: 3.0 mol/L, specific gravity 1.28 g/cc) is sprayed for about 6 minutes to etch the clad material to form the pattern. The etching rate of the copper chloride solution to an iron-based alloy is smaller than that of the ferric chloride solution, so that the Fe-based alloy at a middle portion of the layer can be left easily.

Variation Example of Embodiment 2

Figure 2B:
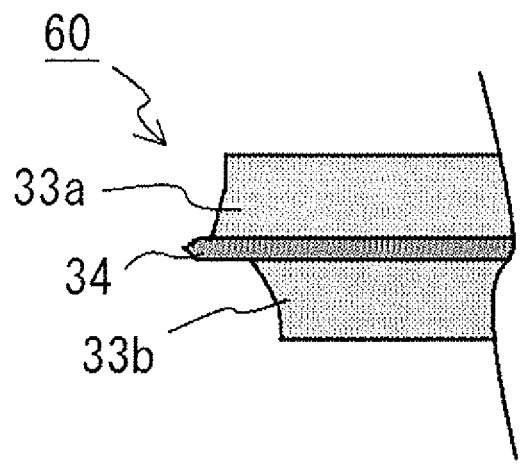
FIG. 2B is a cross-sectional view showing a major part of a lead frame according to a Variation Example of Embodiment 2 of the present invention.

The lead frame 60 according to Variation Example of Embodiment 2 has a similar structure as the lead frame according to Embodiment 1 and Embodiment 2, except that, particularly shown in FIG. 2B, the lead frame 60 is made of a clad material in which a first metal layer 33a of a layer (about 150 µm thickness) made of a copper, and a second metal layer 34 of a layer (about 50 µm thickness) made of an iron alloy (Fe—Ni alloy, Ni: 36 wt %) are stacked to form a stacked-layer structure of first metal layer 33a/second metal layer 34/first metal layer 33b, and in the shape of the end surfaces, the second metal layer 34 is protruded more than the first metal layers 33a, 33b. Such a lead frame 60 can be manufactured in a similar manner as in Embodiment 2, except for reducing the thickness of the second metal layer. With the use of the lead frame as described above, similar effects as in Embodiment 2 can be exerted. Particularly, a very simple technique of adjusting the thickness of the second metal layer enables adjustment of the degree of protrusion, which allows reliable prevention of short-circuit between the lead framed.

Embodiment 3

Figure 3:
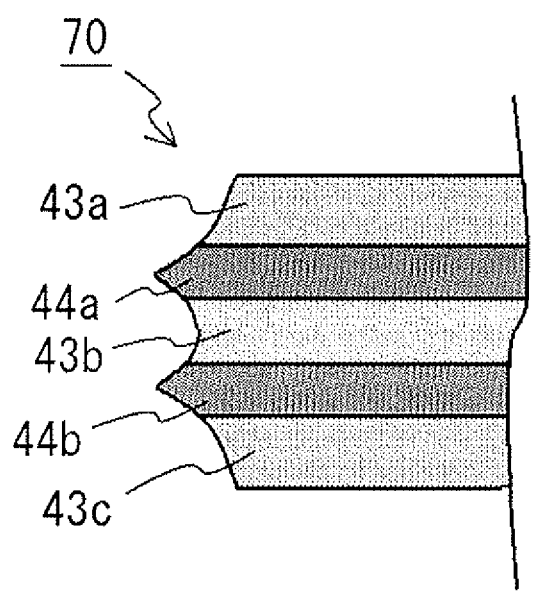
FIG. 3 is a cross-sectional view showing a major part of a lead frame according to Embodiment 3 of the present invention.

The lead frame 70 according to Embodiment 3 has a similar structure as the lead frame according to Embodiment 1, except that, the lead frame 70 is made of a clad material, particularly shown in FIG. 3, the first metal layer 43a of a layer made of copper (about 100 µm thickness) and the second metal layer 44 of a layer made of an iron alloy (Fe—Ni alloy, Ni: 36%,) (about 100 µm thickness) are stacked to form a stacked-layer structure of the first metal layer 43a/the second metal layer 44a/the first metal layer 43b/the second metal layer 44b/the first metal layer 43b, and in the shape of the end surfaces, the second metal layers 24a, 24b are protruded more than the first metal layers 43a, 43b, 43c. Such a lead frame 70 can be manufactured in a similar manner as in Embodiment 2.

With the use of the lead frame as described above, similar effects as in Embodiment 1 and Embodiment 2 can be exerted. Moreover, the end surface is protruded in two steps at a middle part of the lead frame in the thickness direction, so that a greater anchor effect can be obtained with a simple technique.

Embodiment 4

Figure 4A:
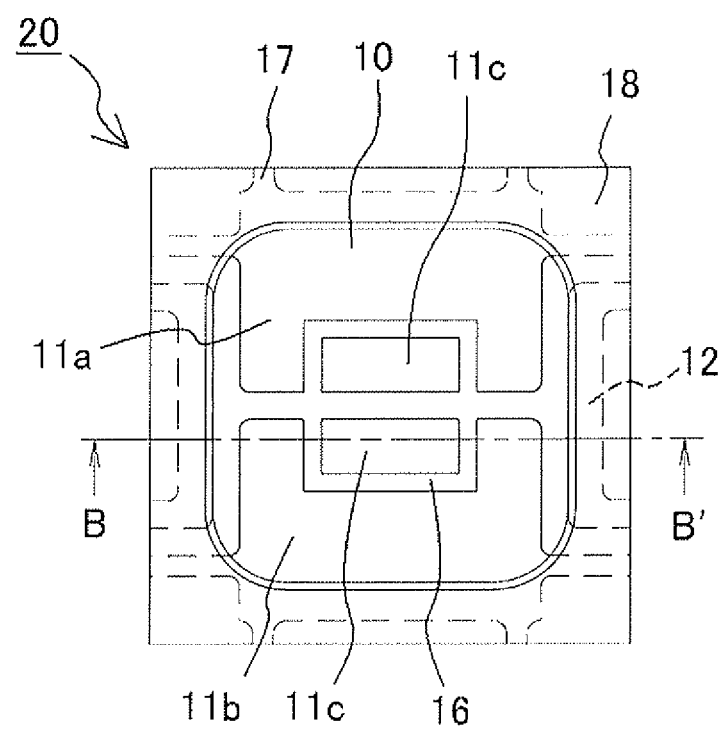
FIG. 4A is a schematic plan view of a light emitting device according to Embodiment 4 of the present invention.
Figure 4B:
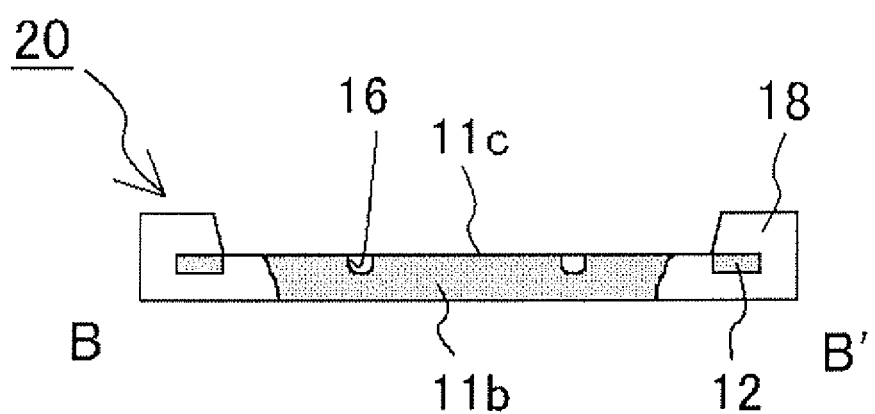
FIG. 4B is a cross sectional view taken along line B-B' of FIG. 4A.

The light emitting device 20 according to Embodiment 4 includes, particularly, as shown in FIG. 4A and FIG. 4B, the lead frame 10 as in Embodiment 1, the resin member 18 which embeds and fix a part of the lead frame 10, and the light emitting element (21 in FIG. 4C) mounted on the lead frame 10. In FIGS. 4A, 4B, in order to clarify the positional relationship between the lead frame, the terminal portions 17 of the lead frame, and the resin member, illustration of other members is omitted.

Figure 4C:
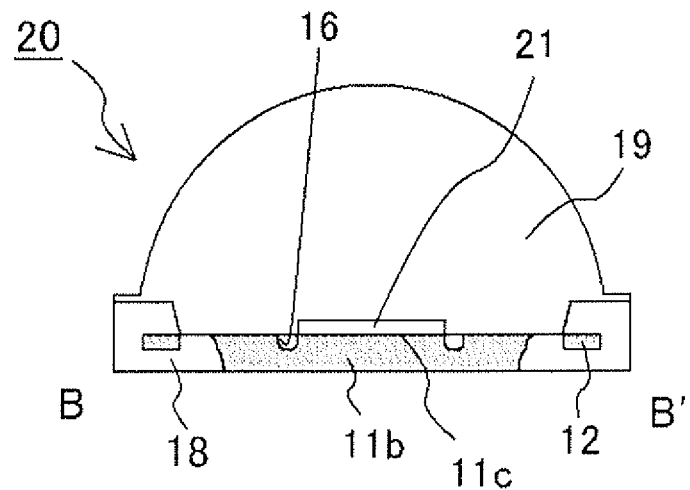
FIG. 4C is a schematic cross-sectional view of a light emitting device which corresponds to FIG. 4A, taken along line B-B' of FIG. 4A.

Between the lead portions 11a, 11b which are spaced apart from and opposite to each other, the resin member 18 covers all the end surface in the thickness direction of the lead frame 10. The light emitting element 21 includes a pair of positive and negative electrodes on the same surface side. The light emitting element 21 is disposed in a face-down manner bridging between the two lead portions 11a, 11b of the element mounting portion 11c of the lead frame 10. That is, with the use of a eutectic solder (Au—Sn) as the bonding member, each of the electrodes of the light emitting element 21 are connected to the lead portions 11a, 11b of the lead frame 10 which are extending to the positive and negative terminals, respectively. Also, as shown in FIG. 4C, over the resin member 18, the light transmissive member 19 covering a part of the lead frame 10 and the light emitting element 21 is arranged in a convex lens shape.

Although not shown, a protective element is mounted on a lead frame 10 which does not have a light emitting element 21 mounted thereon, and the protective element is electrically connected to the lead frame 10 via electrically conductive wires.

In Embodiment 4, a reduction in the linear expansion coefficient of the lead frame itself is achieved due to the use of a Fe-alloy, which has a linear expansion coefficient smaller than that of Cu which is generally used for a lead frame, as the second metal layer 14. With this arrangement, the linear expansion coefficient of the lead frame can be approximated to the linear expansion coefficient of the light emitting element itself. As a result, joint breakage between the light emitting element (for example, electrode) and the lead frame can be prevented. This effect is remarkable, particularly, in the case where the light emitting element is bonded on the lead frame in a face-down manner. Accordingly, in the case where any member is used as the bonding member to bond the light emitting element and the lead frame, with the reduction in the linear expansion coefficient of the lead frame, even there is a difference in the linear expansion coefficients between the bonding member and the light emitting element, the difference becomes possible to be canceled out. Thus, joint breakage between the light emitting element and the lead frame can be further prevented.

Further, while realizing a reduction in the linear expansion coefficient of the lead frame, a material having a linear expansion coefficient larger than that of the light emitting element but has good heat dissipating property can also be used. Accordingly, the heat dissipating property of the light emitting element can be maintained or improved. This also allows employing of a material which has good adhesion with the resin member and/or the bonding member while achieving a reduction in the linear expansion coefficient of the lead frame. Accordingly, the light emitting device of higher reliability can be obtained.

Embodiment 5

Figure 5:
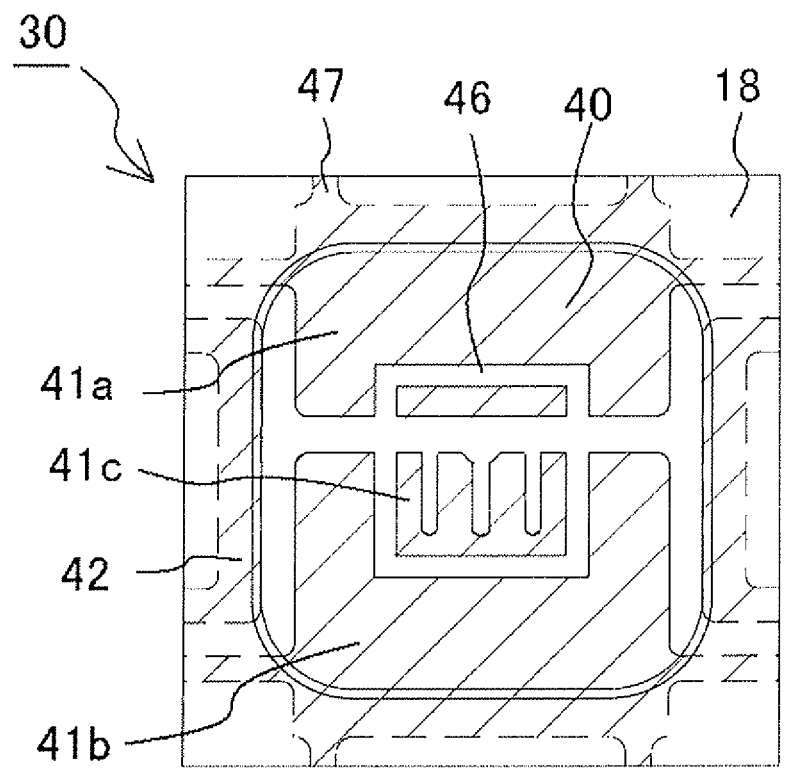
FIG. 5 is a plan view of a light emitting device according to Embodiment 5 of the present invention.

The light emitting device according to Embodiment 5 has a substantially similar structure as in the light emitting device according to Embodiment 4, except that, as shown in FIG. 5, the shape of the element mounting portion 41c of the lead frame 40 is demarcated to be smaller at the lead portion 41a side by the groove 46, and a groove is arranged on the surface of the lead portion 41b. In FIG. 5, in order to clarify the positional relationship between the lead frame 40, the terminal portion 47 and the resin member 18, illustration of other members is omitted.

The groove in the comb-like shape on the surface of the lead portion 41b can be formed such that, in the method of manufacturing lead frame in Embodiment 1, together with the opening for the groove, an opening of a pattern in conformity to the groove which is in a comb-like shape, is also formed in the mask for forming the groove, and etching is carried out simultaneously to the etching of groove 46. With such a comb-like groove, the shape of the element mounting portion 41c of the lead portion 41a can be formed in conformity to the shape of the electrode of the light emitting element. Accordingly, the self-aligning effect of the light emitting element can be further produced. As a result, the light emitting element can be bonded easily to an appropriate location.

The light emitting device according to the present invention can be applied to various kinds of light emitting devices such as illumination light sources, light sources for various kinds of indicators, light sources for automobile use, light sources for displays, back light sources for liquid crystal displays, light sources for sensors, signals, and so on. Also, the light emitting device is applicable to all the light emitting devices, such as so-called side-view type light emitting devices, which use a lead frame.

As illustrated above, embodiments are described to give a concrete form to technical ideas of a method of manufacturing light emitting element according to the present invention, the present invention is not limited to the described embodiments of the present invention. Also, obviously, numerous modifications and variations of the present invention are possible in light of the above teachings, which are within the scope and spirit of the invention, and such other modifications and variations are intended to be covered by the following claims.

What is claimed is:

1. A lead frame comprising:
a clad material including:
a first metal layer comprising a first metal;
a second metal layer comprising a second metal; and
a third metal layer comprising the first metal,
the first metal being different from the second metal, and
the first metal layer, the second metal layer and the third metal layer being stacked in this order,
a through-portion penetrating the clad material;
wherein an end surface of the first metal layer, an end surface of the second metal layer, an end surface of the third metal layer are covered with a plated layer in the through-portion, and
the end surface of the second metal layer protrudes more than the end surface of the first metal layer and the end surface of the third metal layer into the through-portion.

2. The lead frame according to claim 1, wherein:
the first metal layer has a linear expansion coefficient larger than the linear expansion coefficient of the second metal layer.

3. The lead frame according to claim 1, wherein:
the first metal layer has a greater solubility in an etching solution than the second metal layer.

4. The lead frame according to claim 3, wherein:
the etching solution is a solution of ferric chloride or copper chloride.

5. The lead frame according to claim 1, wherein:
an entire end surface of the second metal layer, in its thickness direction is, protrudes more than the end surface of the first metal layer into the through-portion.

6. The lead frame according to claim 1, wherein:
one of the end surface of the first metal layer and the end surface of the third metal layer protrudes farther into the through-portion than the other.

7. The lead frame according to one of claim 1, wherein:
the first metal includes copper or a copper alloy, and
the second metal includes iron or an iron alloy.

8. The lead frame according to claim 1, wherein:
a front surface of the clad material and a back-surface of the clad material is covered with a plated layer.

9. A light emitting device comprising:
a light emitting element including a pair of electrodes, the electrodes being disposed on a front surface side;
a lead frame including a pair of lead portions arranged spaced apart from and opposite to each other, the lead portions electrically connected to the pair of electrodes of the light emitting element via a bonding member; and
a resin member disposed between the lead portions, the resin member fixing the lead frame and covering all end surfaces of the lead frame in a direction perpendicular to the front surface,
the end surfaces of the lead frame being flush with an end surface of the resin member in the direction perpendicular to the front surface.

10. The light emitting device according to claim 9, wherein:
the lead frame includes a clad material including:
a first metal layer comprising a first metal;
a second metal layer comprising a second metal; and
a third metal layer comprising the first metal,
the first metal being different from the second metal, and
the first metal layer, the second metal layer and the third metal layer being stacked in this order,
a through-portion penetrating the clad material;
wherein an end surface of the first metal layer, an end surface of the second metal layer, an end surface of the third metal layer are covered with a plated layer in the through-portion, and
the end surface of the second metal layer protrudes more than the end surface of the first metal layer and the end surface of the third metal layer into the through-portion.

11. The light emitting device according to claim 9, wherein:
the lead frame includes a clad material including:
a first metal layer comprising a first metal;
a second metal layer comprising a second metal; and
a third metal layer comprising the first metal,
the first metal being different from the second metal, and
the first metal layer, the second metal layer and the third metal layer being stacked in this order, and
a through-portion penetrating the clad material;

wherein an end surface of the first metal layer, an end surface of the second metal layer and an end surface of the third metal layer are covered with a plated layer in the through-portion,
the end surface of the first metal layer protrudes more into the through-portion than the end surface of the second metal layer and the end surface of the third metal layer,
the end surface of the second metal layer is slanted so that a first end surface of the second metal layer meets the end surface of the first metal layer, and a second end surface of the second metal layer meets the end surface of the third metal layer, and
the entirety of the end surface of the first metal layer protrudes farther into the through-portion than the end surface of the third metal layer.

12. A lead frame comprising:
a clad material including:
   a first metal layer comprising a first metal;
   a second metal layer comprising a second metal; and
   a third metal layer comprising the first metal,
   the first metal being different from the second metal, and
   the first metal layer, the second metal layer and the third metal layer being stacked in this order, and
a through-portion penetrating the clad material;
wherein an end surface of the first metal layer, an end surface of the second metal layer and an end surface of the third metal layer are covered with a plated layer in the through-portion,
the end surface of the first metal layer protrudes more into the through-portion than the end surface of the second metal layer and the end surface of the third metal layer,
the end surface of the second metal layer is slanted so that a first end surface of the second metal layer meets the end surface of the first metal layer, and a second end surface of the second metal layer meets the end surface of the third metal layer, and
the entirety of the end surface of the first metal layer protrudes farther into the through-portion than the end surface of the third metal layer.

* * * * *